(12) United States Patent
Garrec et al.

(10) Patent No.: US 9,484,898 B2
(45) Date of Patent: Nov. 1, 2016

(54) SYSTEM FOR GENERATING AN ANALOGUE SIGNAL

(71) Applicants: THALES, Courbevoie (FR); CENTRE NATIONAL DE LA RECHERCHE SCIENTIFIQUE, Paris (FR); INSTITUT POLYTECHNIQUE DE BORDEAUX, Talence (FR); UNIVERSITE DE BORDEAUX, Bordeaux (FR)

(72) Inventors: Patrick Garrec, Merignac (FR); Richard Montigny, Pessac (FR); Nicolas Regimbal, Merignac (FR); Yann Deval, Bordeaux (FR); François Rivet, Talence (FR)

(73) Assignees: THALES, Courbevoie (FR); CENTRE NATIONAL DE LA RECHERCE SCIENTIFIQUE, Paris (FR); INSTITUT POLYTECHNIQUE DE BORDEAUX, Talence (FR); UNIVERSITE DE BORDEAUX, Bordeaux (FR)

( * ) Notice: Subject to any disclaimer, the term of this patent is extended or adjusted under 35 U.S.C. 154(b) by 0 days.

(21) Appl. No.: 14/891,297

(22) PCT Filed: May 19, 2014

(86) PCT No.: PCT/EP2014/060249
§ 371 (c)(1),
(2) Date: Nov. 13, 2015

(87) PCT Pub. No.: WO2014/184388
PCT Pub. Date: Nov. 20, 2014

(65) Prior Publication Data
US 2016/0087614 A1    Mar. 24, 2016

(30) Foreign Application Priority Data

May 17, 2013  (FR) ..................................... 13 01142

(51) Int. Cl.
| | |
|---|---|
| H03K 4/02 | (2006.01) |
| H03K 4/94 | (2006.01) |
| H03M 1/66 | (2006.01) |
| H03K 3/64 | (2006.01) |
| H03M 1/74 | (2006.01) |

(52) U.S. Cl.
CPC ........ *H03K 4/94* (2013.01); *H03K 3/64* (2013.01); *H03K 4/023* (2013.01); *H03M 1/661* (2013.01); *H03M 1/745* (2013.01)

(58) Field of Classification Search
CPC ........ H03K 4/023; H03K 4/026; H03K 4/92; H03K 4/94; H03M 1/661; H03M 1/745
USPC ................ 327/101, 105, 106, 107, 129, 130
See application file for complete search history.

(56) References Cited

U.S. PATENT DOCUMENTS

2005/0083219 A1  4/2005  Andersson et al.
2006/0145902 A1  7/2006  Tucholski
(Continued)

FOREIGN PATENT DOCUMENTS

WO     98/00923 A1    1/1998

OTHER PUBLICATIONS

Djordje Babic et al., "Block-Based Methods for Sampling Rate Alteration for Arbitrary Ratio," Telfor2000, Dec. 31, 2000, XP055108577. <http://www.telfor.rs/telfor2000/radovi/7-8.pdf>.

*Primary Examiner* — William Hernandez
(74) *Attorney, Agent, or Firm* — Baker & Hostetler LLP

(57) ABSTRACT

The system has: a set of at least two electric current generators, at least one capacitor and activation/deactivation devices for the electric current generators; the electric current generator being connected in parallel with one another and the capacitor being connected in series with the electric current generators, the activation/deactivation devices controlling the generators by a digital stream allowing control of the intensity of the electric current entering the capacitor and generating a trapezoidal voltage signal at the terminals of the capacitor, the analog signal being reconstructed through interpolation of the trapezoidal signal.

7 Claims, 2 Drawing Sheets

(56) References Cited

U.S. PATENT DOCUMENTS

2009/0206676 A1  8/2009  Chu et al.
2013/0234874 A1* 9/2013  Bailey .................. H03M 1/822
                                                    341/150
2016/0204778 A1* 7/2016  Rossi .................. H03K 17/162
                                                    327/108

* cited by examiner

SYSTEM FOR GENERATING AN ANALOGUE SIGNAL

CROSS-REFERENCE TO RELATED APPLICATIONS

This application is a National Stage of International patent application PCT/EP2014/060249, filed on May 19, 2014, which claims priority to foreign French patent application No. FR 1301142, filed on May 17, 2013, the disclosures of which are incorporated by reference in their entirety.

FIELD OF THE INVENTION

The present invention concerns a system for generating an analog signal from various parameters. Without implying limitation, this invention can be used in the fields of telecommunications, radars, sonars and more generally of all electronic equipments, for example medical instrumentation, test benches or measurement benches.

BACKGROUND

The prior art discloses systems for which the analog signals are predetermined at the time at which the system is designed (in this case, the parameters of the signals are fixed). There are also known systems for which the analog signals are generated on request (in this case, the parameters are sent to the system in real time).

In the case of predetermined signals, the following systems are known:

systems for generating analog signals using basic functions of ramp or logarithm type. These basic functions are obtained, by way of example, by using the knee voltage of one or more diodes, systems having surface acoustic wave filters (SAW), these filters being followed by frequency transposition, systems made up of a set of switched oscillators.

However, these solutions are not flexible and do not allow modification of the parameters of the signal that is generated. Moreover, when switched oscillators are used, the interferences between the oscillators damage the spectral purity of the generated signal.

In order to generate signals that have a predetermined form but whose parameters can evolve, it is known practice to use the following systems:

a system having a voltage controlled oscillator (VCO). This oscillator can be followed by a phase locked loop (PLL), a system having a counter, a memory and a digital/analog converter, all of which is followed by a frequency transposition.

However, these systems are limited because the frequency spread band and the center frequency of the signal that is generated need to be in a limited range.

All of these devices can be integrated into a specialized programmable circuit, also known by the abbreviation "DDS" for direct digital synthesizer.

For signals that are not known in advance and need to be generated on request and in a very short time, the following systems are known:

digital radio frequency memory (DRFM) systems, which allow an analog signal to be stored in memory and this recorded signal to be reconstructed and retransmitted. These systems are particularly used in radars for generating signals that decoy other radars. However, these systems can only generate signals with a small dynamic range, the number of bits of dynamics actually being of the order of a few bits. This order of magnitude is of the order of 1 to 6 bits according to the frequency of the signal to be generated, a sigma/delta converter, this type of converter being based on the principle of oversampling the input signal. This system then has a comparator using one bit to convert the difference between the input signal and the result of the conversion. The result of the comparison is used by a decimator filter, which sums the samples of the input signal. The sigma/delta converter is therefore a servosystem that uses input/output looping. This looping limits the bandwidth of the signal that can be generated.

It is also known practice to use a diode shaper, as shown in FIG. 1. In this system, a voltage ramp is sent to the terminals Vi and will generate a sinusoidal wave that is reconstructed by summation of trapezoids. However, this solution is limited in terms of frequency because the voltage to be generated, which will depend on the derivative of the voltage $V_i(dV_i/dt)$, is limited by the production technology used.

SUMMARY OF THE INVENTION

One aim of this invention is to propose a system for generating signals that is totally reconfigurable, limits perturbations, is able to have a rapidly evolving center frequency, is able to generate large frequency spreadband signals and is able to be implemented on a hybrid analog/digital integrated circuit. To this end, the subject of the invention is a system for generating an analog signal having:

a set of at least two electric generators, at least one capacitor, activation/deactivation means for said electric current generators;

the electric current generating means being connected in parallel with one another and the capacitor being connected in series with the electric current generators, the activation/deactivation means controlling said generators by means of a digital stream allowing control of the intensity of the electric current entering said capacitor and generating a trapezoidal voltage signal at the terminals of said capacitor, said analog signal being reconstructed through interpolation of said trapezoidal signal.

The system therefore provides the following advantages:

reconfiguration is total owing to digital generation of the signals and a very short response time, the frequency generation is performed by a single generator and perturbations are reduced in relation to prior art systems. Thus, radio perturbations, known by the name "glitch", caused by switching are reduced, owing to the use of first-order blockers. This makes it possible to have a reduction in spurious radiations, the speed of evolution of the center frequency of the generated signal is limited only by the clock speed of the activation/deactivation means. It is dependent on the technology used for implementing these means. This makes it possible to generate a signal whose center frequency evolves from DC to microwave frequency, the useful dynamic is limited only by technological compromise, clock speed and bandwidth, the system is in open-loop form, which allows a signal having a large frequency spreadband to be generated, this generation can be implemented totally in a single hybrid analog/digital integrated circuit, the system of the invention has low consumption because the charges of the capacitor are cumulative, moreover, the activation/deactivation device of the electric current generators is of serial type. This makes it possible to have a narrow data transfer bus. Finally, in order to limit the interchanged data, the system uses relative addressing, based on sending of the increase or decrease in the charge of the capacitor, and of the value of the charge of this capacitor.

Advantageously, the activation/deactivation means are adapted to determine the current generating means to be activated/deactivated from a Riemann interpolation of the analog signal to be generated.

Advantageously, the system moreover has:
at least one transistor connected in parallel with the capacitor and/or,
at least one other electric current generating means connected in series with the capacitor,
and means for comparing a value of a voltage at the terminals of said capacitor with a theoretical value.

Moreover, the transistor and/or the other generating means is/are adapted to modify the value of the voltage at the terminals of said capacitor when it is different than the theoretical value.

Advantageously, the system is moreover characterized in that it is integrated on one and the same chip or an integrated circuit or an application-specific integrated circuit.

Advantageously, the system is moreover characterized in that the capacitor is made up of a capacitor of a transistor belonging to the input stage of a power amplifier.

BRIEF DESCRIPTION OF THE DRAWINGS

The invention will be better understood and other advantages will emerge upon reading the detailed description provided by way of nonlimiting example and with reference to the figures, among which.

DETAILED DESCRIPTION

Figure 1:
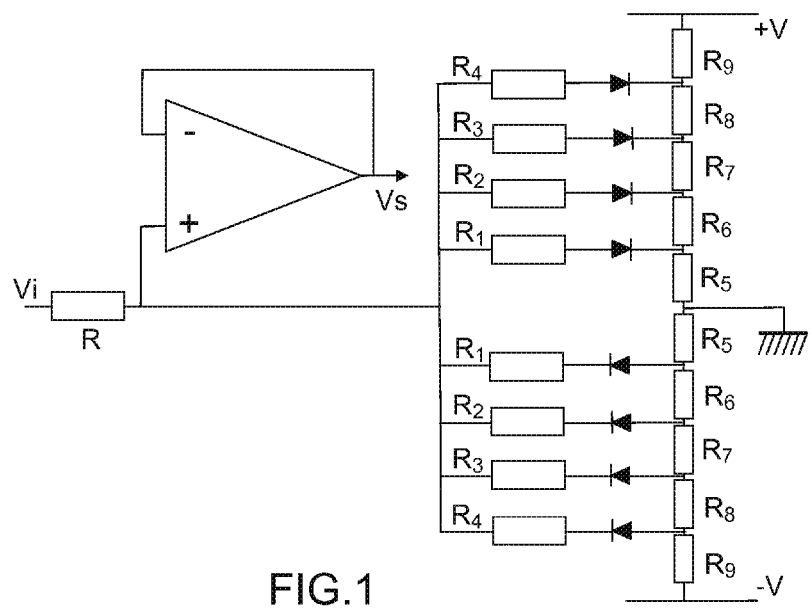
FIG. 1 presents a system that is known in the prior art
Figure 2:
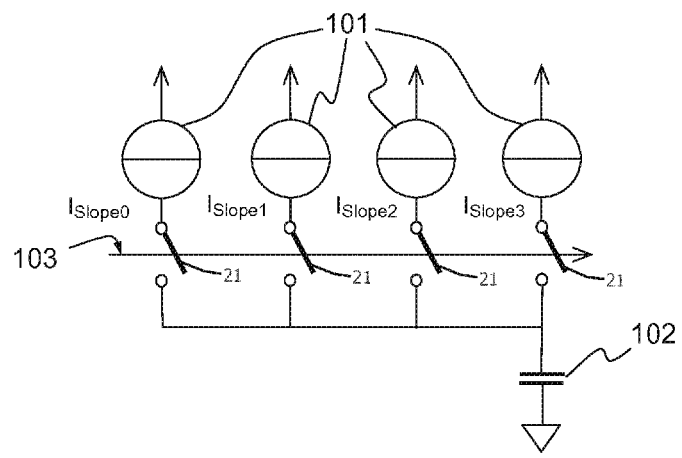
FIG. 2 presents a first embodiment of the system presented in the invention

The system, which is described in FIG. 2, has four electric current generators 101. These electric current generators are connected to one another, in parallel, and are connected to a capacitor 102, which is therefore charged by this capacitor. The voltage at the terminals of the capacitor varies in accordance with the law $$V = \frac{1}{C} \int I dt.$$

In this equation, V is the voltage (in volts) at the terminals of the capacitor, I is the intensity (in amps) of the electric current flowing through the capacitor and C is the capacitance (in farads) of the capacitor. The system also has activation/deactivation devices 103 that allow the electric current generators 101 to be activated and deactivated.

In this system, the intensity entering the capacitor is dependent on the number of electric current generators connected to the capacitor. Therefore, the slope of the increase in the voltage at the terminals of the capacitor is likewise dependent on this same number of generators.

In practice, one can afford just to dynamically vary the electric current in order to avoid the charge transfer in the capacitance. By way of example, it is possible to discharge the capacitor(s) by passing a negative current through it.

The activation/deactivation control 103 is provided by means of a digital stream allowing control of the intensity of the electric current entering the capacitor according to the signal to be generated. This control is effected by varying the number of intensity generators that are activated at a given instant. To this end, the digital stream controls, via suitable interfaces, the closing or opening of switches 21 that each connect a current generator 101 to the capacitor 102. The digital stream, for example of serial type, has a word defining a configuration for the switches.

Figure 3:
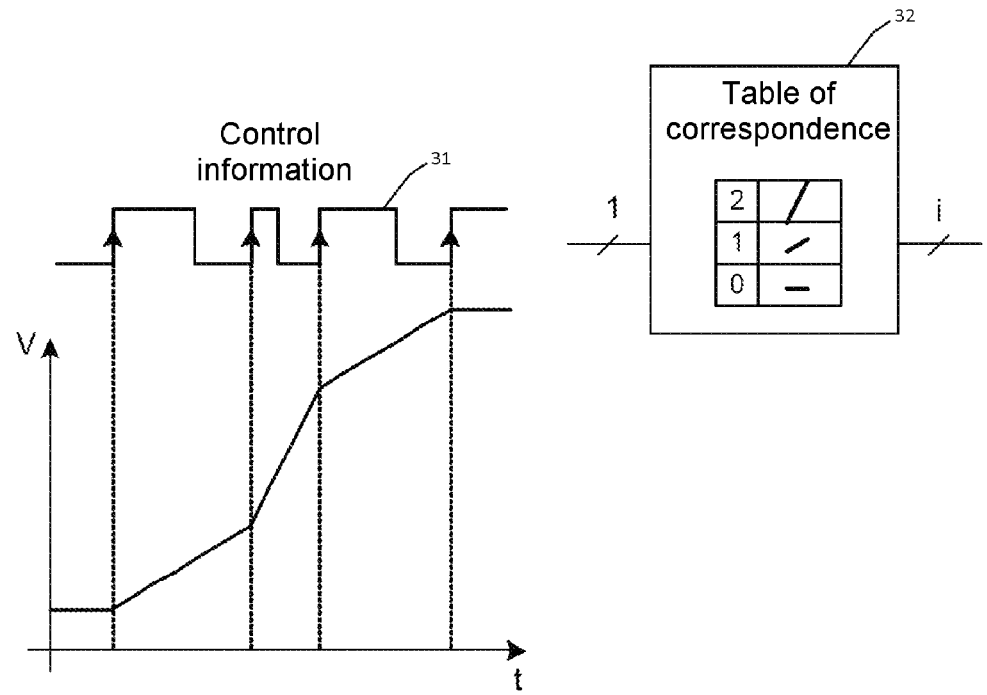
FIG. 3 presents an embodiment of the control of the slope of the analog signal

FIG. 3 presents this embodiment of the activation/deactivation control for the electric current generators. More particularly, it illustrates the digital stream 31, which is of serial type in this example. The serial data are encompassed by a table of correspondence 32 that presents, at the output, a word encoded using i bits, which is dependent on the serial input data and a clock cycle, these i bits controlling the transfer of current in the capacitor 102 from the current generators, each bit activating a switch to close or open. In one embodiment, the number of electric current generators is minimal and is fixed at two. In this embodiment, two slopes with opposite signs, which slopes are obtained via the two electric current generators having a different intensity, allow the analog signals to be generated. Moreover, rapid switching between the two intensity generators allows faithful generation of the analog signal.

In another embodiment, the number of electric current generators is greater. In this embodiment, a plurality of slopes, obtained via the simultaneous activation of a plurality of electric current generators, via the digital stream, having a different intensity, allow the analog signals to be generated. In this embodiment, it is not necessary to effect rapid switching between the intensity generators in order to faithfully generate the analog signal.

For example, FIG. 3 presents different currents using power 2 values as shown in the table of correspondence.

The determination of the various slopes that the signal must successively follow (also called control law) is effected so as to minimize the gap between:
the analog signal that there is a wish to generate
the signal reconstructed from the use of these various slopes.

In order to effect this determination, various methods of interpolation of the signal can be set up (Riemann, Romberg, least squares, polynomials, Kalmann, etc.).

In one embodiment, it is possible to use an interpolation of Riemann type. In this case, the analog signal to be generated is modeled by a set of trapezoids representing the Riemann integral. The various slopes of the trapezoids are fixed by the value of the intensities that the combinations of the various electric current generators can deliver. This is because the voltage slopes that can be produced at the terminals of the capacitor are dependent on the intensity of the electric current $I_{slope}$ flowing through it and on the capacitance $C_{load}$ of the capacitor. Thus, the succession of the slopes of the voltage at the terminals of the capacitor is chosen on the basis of two criteria:
these slopes can be produced by the system
these slopes minimize the gap between the signal generated in this manner and the signal that there is a wish to generate.

The value of this electric current is chosen digitally from the possible values via a control word that controls the activation/deactivation of the electric current generators. A first-order blocker is obtained, which allows the value of the slope of the voltage at the terminals of the capacitor to be stored in memory. The control words can be addressed by an addressing table, which is preprogrammed or computed dynamically. Moreover, as the high-impedance control is native, this can be accomplished by disconnecting the current generators so that the charge of the capacitor remains constant, a control word allowing cancellation of the electric current flowing through the capacitor resulting in the voltage at the terminals of the latter being maintained.

The system, which is made up of the plurality of electric current generators and the activation/deactivation device, forms a charge pump. This is because it allows the transfer of charges between the electric current generators 101 and the capacitor 102. The value of the charge in this capacitor is dependent on the value of the electric current passing through it and on the duration of this charge. Moreover, if the control law is based on the Riemann algorithm, this system is called a Riemann pump.

Figure 4:
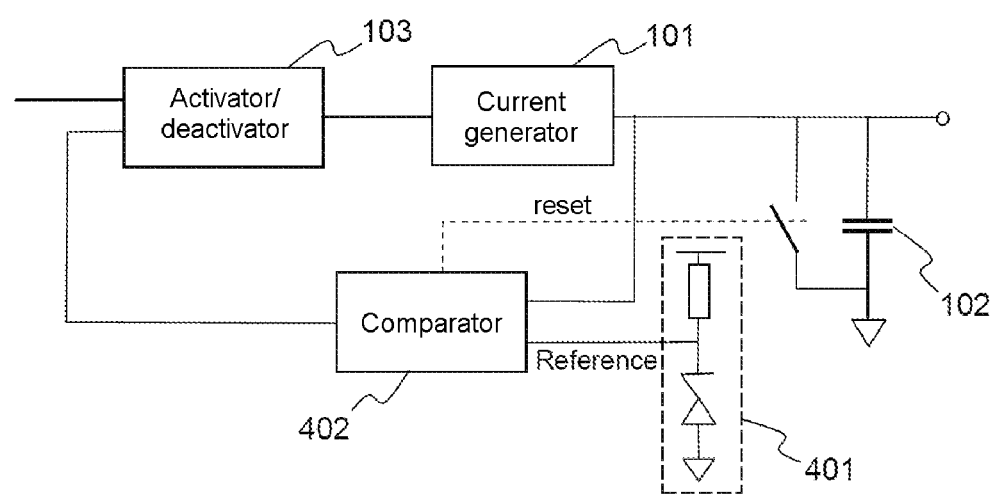
FIG. 4 presents an embodiment of a device for resetting the system.

In an embodiment that is presented in FIG. 4, the system likewise has a device for compensating for the leakage electric current and for resetting. This device makes it possible to prevent the accumulation of errors that can cause the value of the charge in the capacitor to diverge. This device is asynchronous and can be produced by a transistor 401 connected in parallel with the capacitor or else an appended set of electric current generators. This system also has a device 402 for comparing a value of a voltage at the terminals of said capacitor with a theoretical value.

Compensation for slow drifts is provided by detection of the transition of the signal through known and referenced levels. Transitions to these levels prompt the system to compare the voltage with a theoretical value and to make the corrections to return to the setpoint value through successive increments. Thus, every transition through zero prompts the content of the capacitor to be reset in order to prevent any drift (offset).

Equally, it is possible to correct slope errors by modifying the control law generated by the device for activating/deactivating the electric current generators. If the control law is optimized, the errors will be minimal. It is then possible to predetermine the corrections by means of control extrapolations.

To prevent capacitor discharges and hence overheating, it is possible to take two capacitors and to interchange the capacitors on each transition, the value of the charge of the capacitor off line being brought back to the reference value by a service circuit.

In one embodiment, the capacitor 102 is made up by the capacitor of a transistor belonging to the input stage of a power amplifier. In this case, the signal generated by the system has, directly, a high power of a few hundred milliwatts.

In one embodiment, the system is integrated on one and the same chip, an integrated circuit or an application-specific integrated circuit or "ASIC". The system is integrated in a chip with technology suited to the conditions of use. For example, it is possible to use:

SIGe or CMOS for low-cost production of a large number of units

GaN for quickness, robustness and the possibility of having a high-power output signal.

The invention claimed is:

1. A system for generating an analog signal having at least:
    a set of at least two electric current generators
    at least one capacitor
    activation/deactivation devices for said electric current generators;
    the electric current generators being connected in parallel with one another and the capacitor being connected in series with the electric current generators, the activation/deactivation devices controlling said generators by means of a digital stream allowing control of the intensity of the electric current entering said capacitor and generating a trapezoidal voltage signal at the terminals of said capacitor, said analog signal being reconstructed through interpolation of said trapezoidal signal.

2. The system of claim 1, wherein said interpolation is of Riemann type.

3. The system of claim 1, further comprising:
    at least one transistor connected in parallel with the capacitor and/or
    at least one other electric current generator connected in series with the capacitor
    and a comparator for comparing a value of a voltage at the terminals of said capacitor with a theoretical value;
    said transistor and/or said other electric current generator being adapted to modify said value of the voltage at the terminals of said capacitor when it is different than said theoretical value.

4. The system of claim 1, the system being integrated on one and the same chip.

5. The system of claim 1, wherein said capacitor is made up of a capacitor of a transistor belonging to the input stage of a power amplifier.

6. The system of claim 1, the system being integrated on an integrated circuit.

7. The system of claim 1, the system being integrated on an application-specific integrated circuit.

* * * * *